US006484295B1

(12) United States Patent
McBride et al.

(10) Patent No.: US 6,484,295 B1
(45) Date of Patent: *Nov. 19, 2002

(54) ELECTRICAL RULES CHECKER SYSTEM AND METHOD PROVIDING QUALITY ASSURANCE OF TRI-STATE LOGIC

(75) Inventors: John G McBride, Ft Collins, CO (US); Jan Kok, Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 192 days.

This patent is subject to a terminal disclaimer.

(21) Appl. No.: 09/639,614

(22) Filed: Aug. 15, 2000

(51) Int. Cl.[7] .............................................. G06F 17/50
(52) U.S. Cl. .............................................. 716/4; 716/5
(58) Field of Search ............................... 716/4, 5, 6, 2, 716/12; 702/69

(56) References Cited

U.S. PATENT DOCUMENTS

| | | | | |
|---|---|---|---|---|
| 6,249,899 B1 | * | 6/2001 | McBride et al. ................ | 716/4 |
| 6,260,180 B1 | * | 7/2001 | McBride ....................... | 438/10 |
| 6,301,691 B1 | * | 10/2001 | McBride ......................... | 716/2 |
| 6,305,003 B1 | * | 10/2001 | McBride ....................... | 716/12 |
| 6,308,301 B1 | * | 10/2001 | McBride et al. ................ | 716/4 |
| 6,311,314 B1 | * | 10/2001 | McBride ......................... | 716/6 |
| 6,321,365 B1 | * | 11/2001 | McBride ....................... | 703/14 |
| 6,327,542 B1 | * | 12/2001 | McBride ....................... | 702/191 |

* cited by examiner

*Primary Examiner*—Vuthe Siek
*Assistant Examiner*—Binh C. Tat (57) ABSTRACT

An electrical rules checker system and method are provided to appraise tri-state logic connected to a selected node of an integrated circuit by evaluating a netlist. In accordance with one aspect of the invention, the method selects a circuit configuration to be identified. Next, the method identifies any of the circuit configurations at the node, and identifies any probable circuit configurations at the node. Then the method appraises the circuit configurations and the probable circuit configurations. In accordance with another aspect of the invention, a system is provided for appraising tri-state logic connected to a selected node of an integrated circuit. The system operates by evaluating a netlist at the node, and further includes a code segment for selecting a circuit configuration to be identified, a second code segment for identify any of the selected circuit configurations a given node in a netlist, and a third code segment configured to identify any probable circuit configurations at the node in a netlist. A fourth code segment appraises the identified circuit configurations and probable circuit configurations.

15 Claims, 9 Drawing Sheets

ELEMENT {~~~~
~~~~

Complementary Pass FET
    Special Complementary Pass FET
    RAM Cells
    Single Pass FET
    Feedback FET
    Static Gates
    Probable

~~~~

~~~~

Direction: Unset, Bidirectional, Source-to-Drain, Drain-to-Source,

NODE {~~~~
~~~~

Output
    Inverter Outputs
    Latch
    Precharged
    Dynamic
    Static
    Clock driver
    Mux Output

ELECTRICAL RULES CHECKER SYSTEM AND METHOD PROVIDING QUALITY ASSURANCE OF TRI-STATE LOGIC

BACKGROUND OF THE INVENTION

1. Field of the Invention

The present invention generally relates to computer-aided circuit design systems, and more particularly to an electrical rules checker system and method for establishing the quality assurance of identified tri-state logic elements.

2. Discussion of the Related Art

Integrated circuits (ICs) are electrical circuits comprised of transistors, resistors, capacitors, and other components on a single semiconductor "chip" in which the components are interconnected to perform a variety of functions. Typical examples of ICs include, for example, microprocessors, programmable logic devices (PLDs), electrically erasable programmable memory devices (EEPROMs), random access memory devices (RAMs), operational amplifiers and voltage regulators. A circuit designer typically designs the IC by creating a circuit schematic indicating the electrical components and their interconnections. Often, designs are simulated by computer to verify functionality and to ensure that performance goals are satisfied.

In the world of electrical device engineering, the design and analysis work involved in producing electronic devices is often performed using electronic computer aided design (E-CAD) tools. As will be appreciated, electronic devices include electrical analog, digital, mixed hardware, optical, electromechanical, and a variety of other electrical devices. The design and subsequent simulation of any circuit board, very large scale integration chip, or other electrical device via E-CAD tools allows a product to be thoroughly tested and often eliminates the need for building a prototype. Thus, today's sophisticated E-CAD tools may enable the circuit manufacturer to go directly to the manufacturing stage without having to perform costly, time consuming prototyping.

In order to perform the simulation and analysis of a hardware device, E-CAD tools utilize an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often, a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module, which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules," will mask the complexities therein, typically showing only input/output ports.

An IC design can be represented at different levels of abstraction, such as at the Register-Transfer level (RTL) and the at logic level, using a hardware description language (HDL). VHDL and Verilog are examples of HDL languages. At any abstraction level, an IC design is specified using behavioral or structural descriptions, or a mix of both. At the logical level, the behavioral description is specified using Boolean equations. The structural description is represented as a netlist of primitive cells. Examples of primitive cells are, among others, full-adders, logic gates, latches, and flip flops.

Set forth above is some very basic information regarding integrated circuits and other circuit schematics that are represented in netlists. Systems are presently known that use the information provided in netlists to evaluate circuit timing and other related parameters. More specifically, systems are known that perform a timing analysis of circuits using netlist files. Although the operational specifics may vary from system to system, generally such systems operate by identifying certain critical timing paths, then evaluating the circuit to determine whether timing violations may occur through the critical paths. As is known, timing specifications may be provided to such systems by way of a configuration file.

One such system known in the prior art is marketed and commercially available under the name PathMill, by EPIC Design Technology, Inc., U.S.A. PathMill is a transistor-based analysis tool used to find critical paths and to verify timing in semiconductor designs. Using static and mixed-level timing analysis, the PathMill system processes transistors, gates, and timing models. It also calculates timing delays, performs path searches, and checks timing requirements. As is known, the PathMill system can analyze combinational designs containing gates, and sequential designs containing gates, latches, flip-flops, and clocks. Combinational designs are generally measured through the longest and shortest paths.

Figure 1:
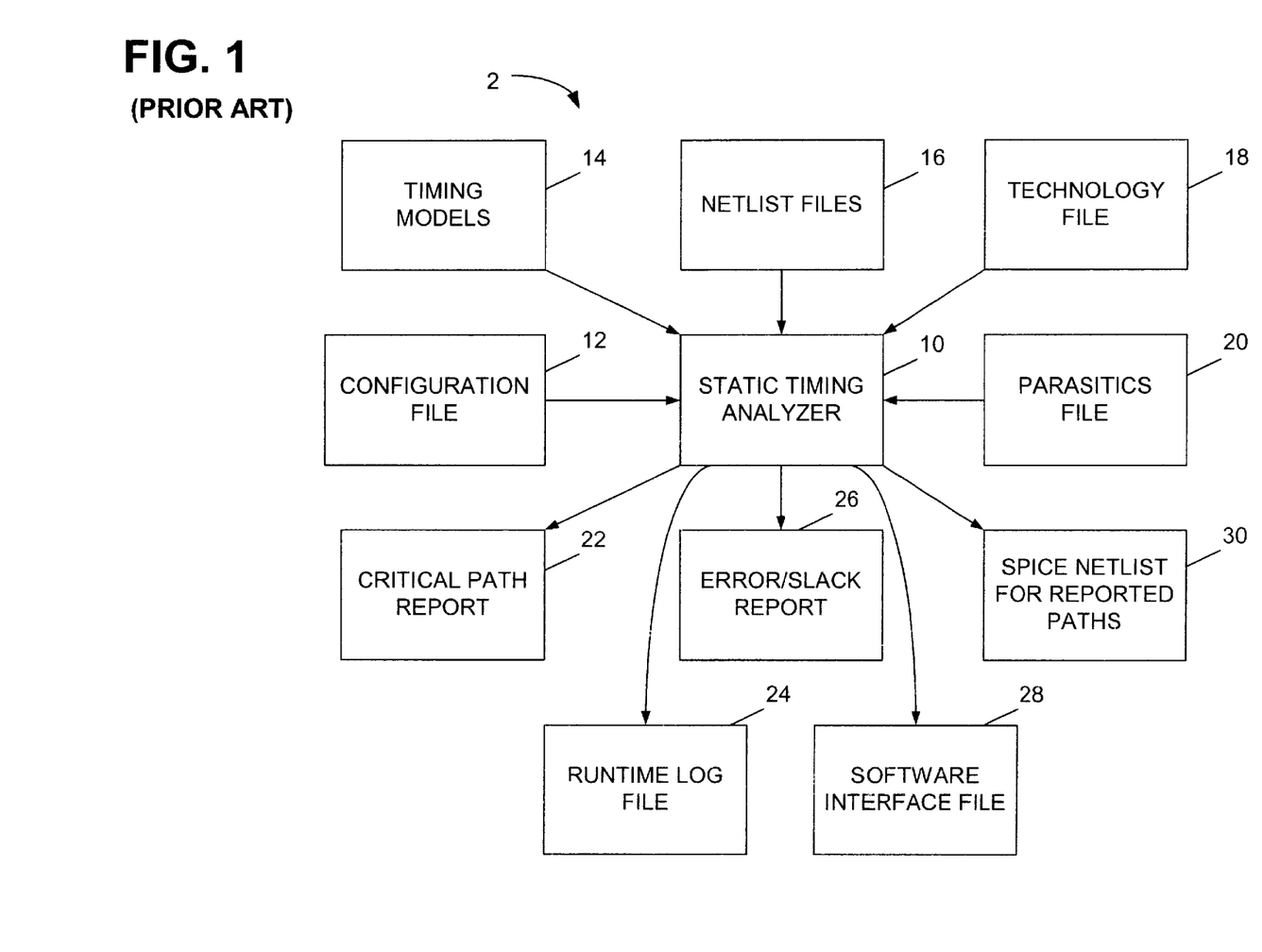
FIG. 1 is a block diagram of a static timing analyzer system, as is known in the prior art.

Illustrated in FIG. 1 is a block diagram of a prior art static timing analyzer system that illustrates the basic informational flow in such a system and that is generally denoted by reference numeral 2. Specifically, and as previously mentioned, one such system 2 is marketed under the name PathMill. FIG. 1 is a diagram that illustrates the informational flow in such a system 2. At the center of the diagram is a static timing analyzer 10, (i.e., the PathMill program). Surrounding this block 10 are a number of other blocks that represent various input and output files and/or information.

More particularly, the static timing analyzer 10 may utilize a configuration file 12, a file of timing models 14, one or more netlist files 16, a technology file 18, and a parasitic file 20, for various input information. In addition, the static timing analyzer 10 may generate a number of different output files or other output information, including a critical path report 22, a runtime log file 24, an error report 26, a software interface file 28, and a SPICE netlist 30. When started, the static timing analyzer 10 first processes the input netlist file(s) 16, the technology file 18, and the configuration files 12. The information from these files is subsequently used for performing path analyses. Since the static timing analyzer 10, (i.e., the PathMill program) is publicly available and marketed, its function and operation are well known, and therefore need not be discussed in detail herein.

While tools such as these are useful for the design verification process after layout, there are various shortcomings in the static timing analyzer 10, (i.e., the PathMill program) and other similar products. These shortcomings include, but are not limited to, the ability to identify the probable identity of unknown logic gates or particular combinations of logic gates of the circuit. This is because of the pervasive problems in rules checking programs that are unable to inclusively determine all of the time whether certain parts of a design are actually certain types of structures.

With this uncertainty the rules checker program cannot completely certify the circuit design. More specifically, there is sometimes a need to identify combinations of gates that are configured in such a manner that may lead to operational uncertainty or performance problems. There are various reasons why such a gate identification may be desirable, which will be appreciated by those skilled in the art.

Furthermore, there is also a current need to establish the quality assurance of those elements that are assigned a probable identity. This allows a user to validate the quality of the assumed identity of the circuit identified as a probable structure type.

SUMMARY OF THE INVENTION

The present invention provides an electrical rules checker system and method for providing electronic rules checking with identification and appraisal of tri-state logic from a netlist. Tri-state logic is one or more logic elements that can be identified positively as being in a particular circuit configuration, identified probably as being in a particular circuit configurations and not identified positively as being in a particular circuit configuration.

Briefly described, in architecture, the electrical rules checker can be implemented as follows. The system operates by evaluating a netlist at the node, and further includes a code segment for selecting a circuit configuration to be identified. A second code segment identifies any of the selected circuit configurations a given node in a netlist, and a third code segment identifies any probable circuit configurations at the node in a netlist. A fourth code segment appraises the identified circuit configurations and probable circuit configurations.

The present invention can also be viewed as providing a method for appraising tri-state logic connected to a selected node of an integrated circuit. In this regard, the method can be broadly summarized by the following steps: (1) selecting a circuit configuration to be identified; (2) identifying any of the circuit configurations at the node; (3) identifying any probable circuit configurations at the node; and (4) appraising the circuit configurations and the probable circuit configurations.

DESCRIPTION OF THE DRAWINGS

The accompanying drawings incorporated in and forming a part of the specification illustrate several aspects of the present invention, and together with the description serve to explain the principles of the invention. In the drawings.

DETAILED DESCRIPTION OF THE PREFERRED EMBODIMENT

Having summarized various aspects of the present invention, the invention will now be described in detail with reference to the drawings. While the invention will be described in connection with these drawings, there is no intent to limit it to the embodiment or embodiments disclosed therein. On the contrary, the intent is to cover all alternatives, modifications and equivalents included within the spirit and scope of the invention as protected by the appended claims.

Figure 2:
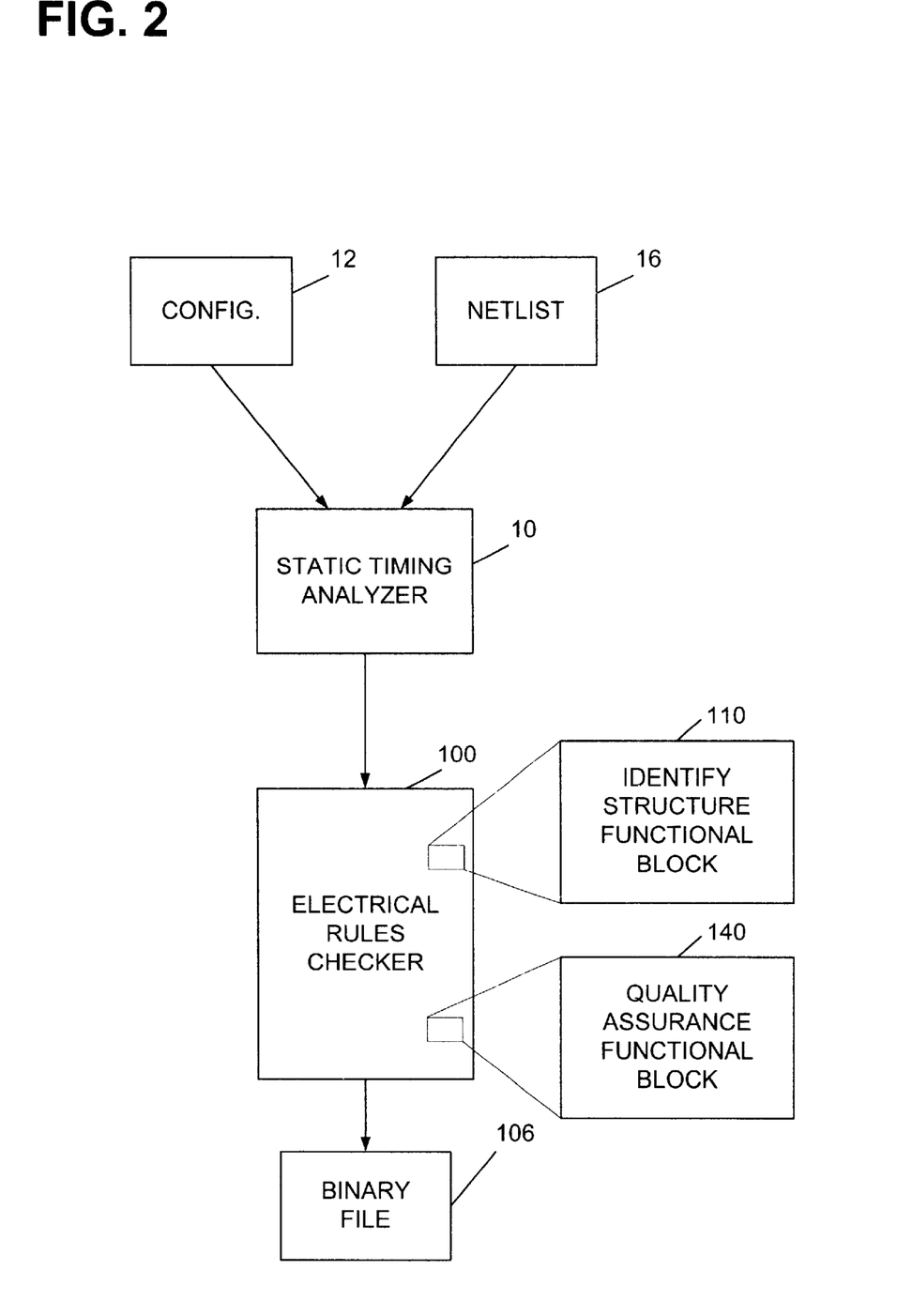
FIG. 2 is a block diagram illustrating the orientation of the electrical rules checker including an identify structure functional block of the present invention, in relation to an existing static timing analyzer.

Illustrated in FIG. 2 is one embodiment of a system constructed in accordance with the present invention. In the illustrated embodiment, only the static timing analyzer 10, the configuration file 12 and the netlist file 16 from FIG. 1 are shown. The configuration file(s) 12 contains information that informs the static timing analyzer 10 how to perform its analysis, and various numbers of configuration files may be used. The netlist file 16, as is well known, defines the various integrated circuit components, and their inter-relations. The static timing analyzer 10 may make available to the electrical rules checker 100 a binary file output 106.

The electrical rules checker 100 preferably is configured to operate on an output of the static timing analyzer 10. In this regard, the static timing analyzer may be configured to generate output netlist files 16, which the electrical rules checker 100 utilizes as an input. As previously mentioned, there are a wide variety of reasons why an electrical rules checker 100 may be desired. One such reason to utilize an electrical rules checker 100 is to perform various checks over certain rules or strategies in an integrated circuit design. Such rules may vary from circuit to circuit, depending upon the particular application.

The electrical rules checker 100 operates to provide a method for identifying tri-state logic in a netlist. Tri-state logic is one or more logic elements that can be positively identified as being in a particular circuit configuration, identified as probably a particular circuit configuration of elements and positively not identified as any circuit configuration of elements. Another portion of the electronic rules checker 100 includes the preferred embodiment of the present invention and operates to provide a method to establish the quality assurance of the identified tri-state logic. In this operation, the method to establish quality assurance of tri-state logic evaluates each of the tri-state elements to ascertain the quality of the identification of the tri-state logic.

The electrical rules checker 100, identifies tri-state logic in a circuit design, and performs the electronic rules checking on the element structures in the netlist 16 and it also includes a method for establishing the quality assurance of the identified tri-state logic. The first step in checking for tri-state logic is achieved by identifying the resistors and transistors in each functional block for known element structure types.

After identifying known element structure types there is a check for probable element structure types. The known element structures and probable element structures are listed in the configuration file 12. The identified known element structure types and probable element structure types are then saved to an output binary file 106 as shown in FIG. 2, which may ultimately be used in subsequent executions of the electrical rules checker system 100. After identifying all the known and probable element structure types, the electronic rules checker 100 including the system and method of the present invention for establishing the quality assurance of the identified element structure types, evaluate the identified element structure types.

Figure 3:
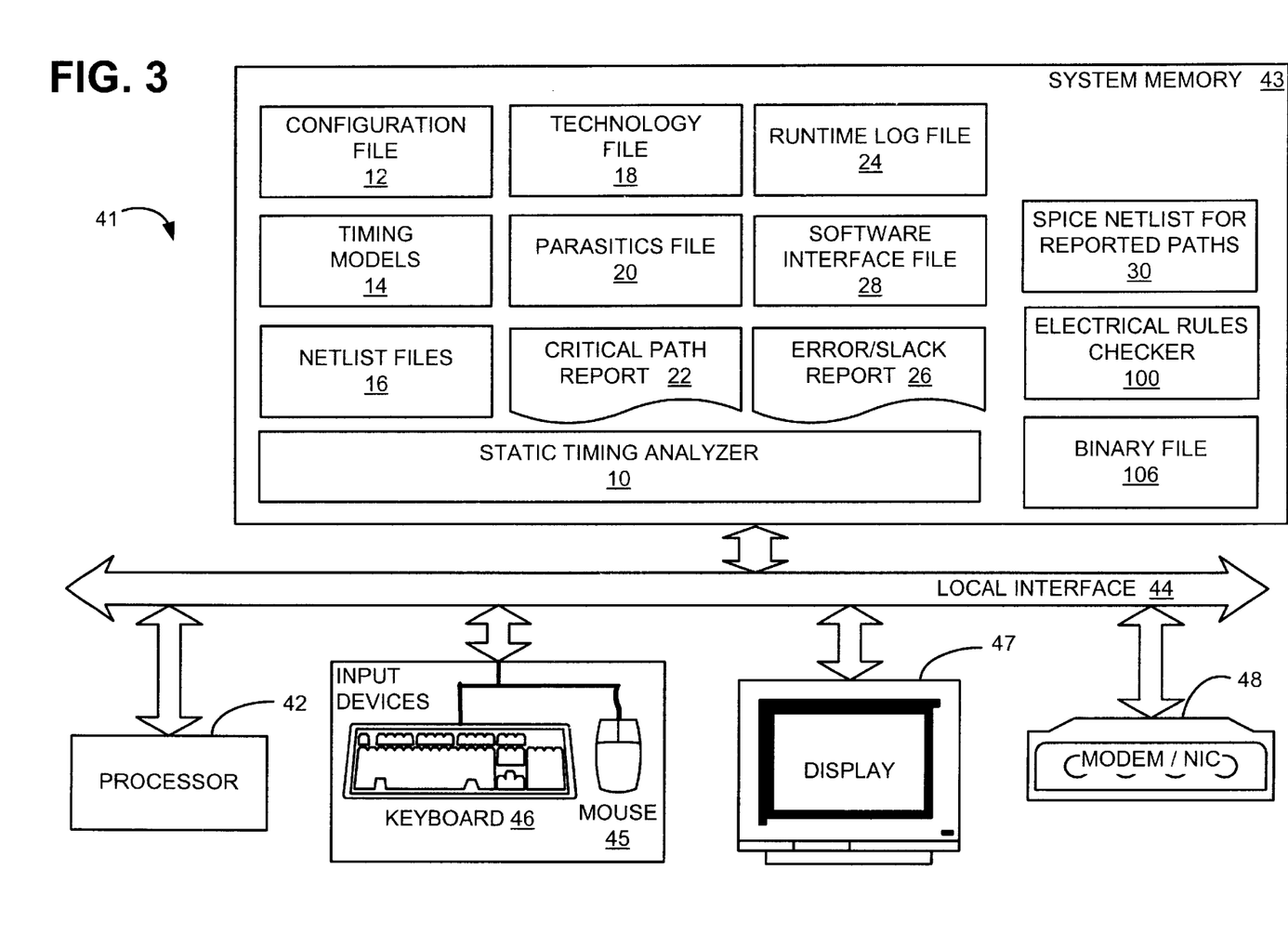
FIG. 3 is a block diagram illustrating the electrical rules checker of FIG. 2, situated within a computer readable medium, for example, in a computer system.

Illustrated in FIG. 3 is a block diagram showing the electrical rules checker 100 of the present invention, situated within a computer readable medium, such as, for example, a memory in a general-purpose computer system 41. These general-purpose computer systems can identify, access, and process resources desired by a user.

The general-purpose computer system 41 comprises, typically, among other things, a processor 42 and a system memory 43 with an operating system (not shown, which is executed by the processor 42). The processor 42 accepts data from system memory 43 over the local interface 44 (e.g., one or more buses). The system memory 43 can be either one or a combination of the common types of memory, for example, but not limited to, erasable programmable read only memory (EPROM), electronically erasable programmable read only memory (EEPROM), flash memory, programmable read only memory (PROM), random access memory (RAM), read only memory (ROM), flash memory, dynamic random access memory (DRAM), static random access memory (SRAM), system memory, or nonvolatile memory such as disk drives, tape drives, compact disc read only memory (CD-ROM) drives, cartridges, cassettes, or memory located on a network server.

Direction from the user can be signaled to the processor 42 by using one or more input devices, for example, but not limited to, a mouse 45 and keyboard 46. The action input and/or result output can typically be displayed on one or more output devices, for example, a display device 47. The computer system 41 includes user network interface type program(s) for use in accessing data on a network. These user network interface type program(s) (not shown) reside in system memory 42 and access communication facilities modem/network interface card (NIC) 48 to transport to and from other resources connected on a network (not shown).

The electrical rules checker 100 can be implemented in hardware, software, firmware or a combination thereof. In the preferred embodiment, the electrical rules checker 100 with the tri-state identification logic and quality assurance logic is implemented in software or firmware that is stored in a memory, such as the system memory 43, and that is executed by a suitable instruction execution system, such as processor 42.

Shown in FIG. 3 is the static timing analyzer 10 and electrical rules checker 100 with the tri-state identification logic and quality assurance logic situated in memory 43 in the computer system 41. The configuration file 12, file of timing models 14, one or more netlist files 16, technology file 18, and a parasitic file 20, containing various input information are also situated in memory 43. The critical path report 22, runtime log file 24, error report 26, software interface file 28, SPICE (i.e., a circuit simulator) netlist 30, and binary file 106 output files or other output information are also situated in memory 43. The process to identify element structural types 110 and identify probable element structural types 120 of tri-state logic devices are herein defined in further detail with regard to FIGS. 5 and 6.

Figure 4A:
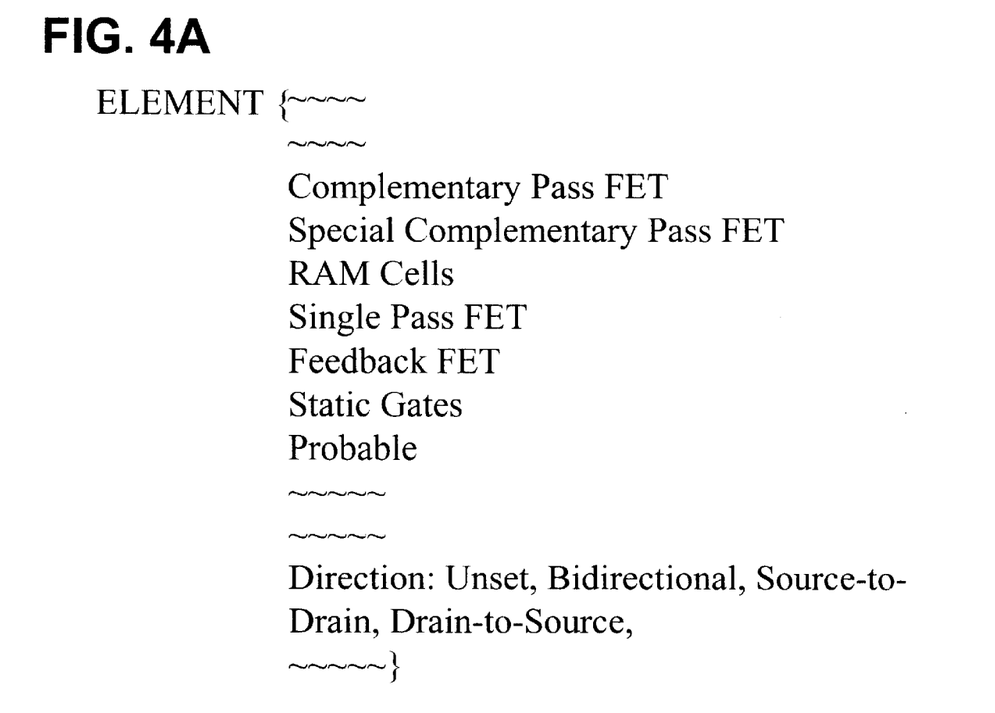
FIG. 4A is a diagram illustrating a portion of a data structure of a circuit element, depicting certain flags that may be set by the electrical rules checker shown in FIG. 3.

As illustrated in FIG. 4A, one aspect of the present invention is to provide a method for detecting and evaluating tri-state logic devices from a netlist. Tri-state logic is defined as one or more logic elements that can be identified positively as being in a particular circuit configuration, identified probably as being in a particular circuit configuration, and not identified positively as being in a particular circuit configuration.

In accordance with the invention, numerous different types of tri-state logic may be identified. These include, but are not limited to, complementary pass FETs, special complementary pass FETs, RAM cells, feedback FETs, gate outputs, and single pass FETs. In accordance with the present invention, a data structure is associated with each element of a netlist (See FIG. 4A). Among a large number of parameters or characteristics, the element data structure of the preferred embodiment includes separate flags that may be used in identifying the given element as a particular device. Specifically, a "Complementary Pass FET" flag may be set if the element is determined to be a complementary pass FET, a special complementary pass FET may be set if the element is determined to be a special complementary pass FET, a "Gate output" flag may be set if the element is determined to be a gate output, a "RAM cell" flag may be set if the element is determined to be a RAM pass FET, a "Feedback FET" may be set if the element is determined to be a feedback FET, and a "Single Pass FET" flag may be set if the element is determined to be a single pass FET. For marking a probable circuit structure for any of the above, the "probable" flag may be set.

Figure 4B:
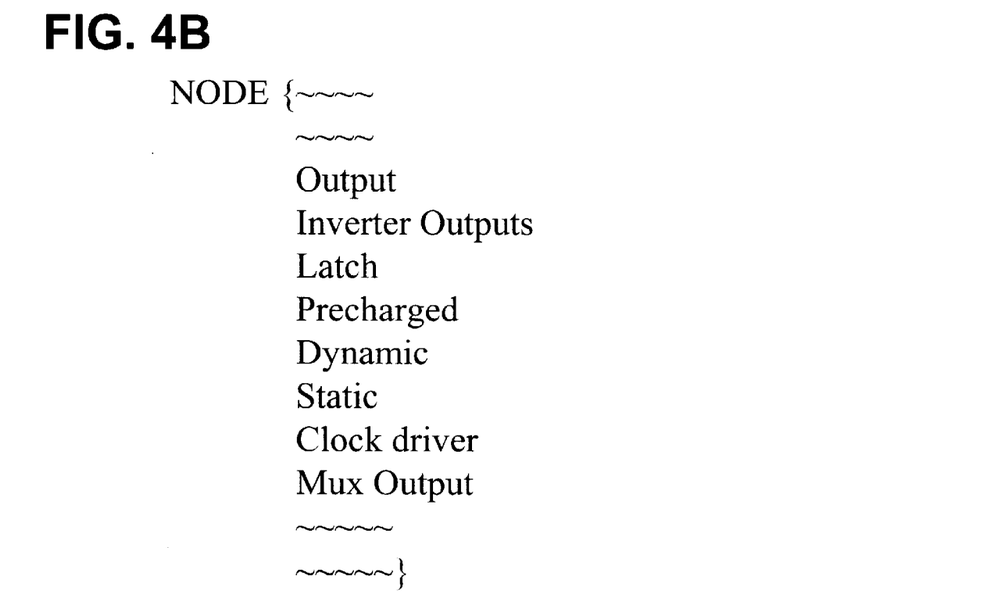
FIG. 4B is a diagram illustrating a portion of a data structure of a circuit node, depicting certain flags that may be set by the electrical rules checker shown in FIG. 3.

Illustrated in FIG. 4B is a data structure of a circuit node, depicting certain flags that may be set, in accordance with the invention. In accordance with the preferred embodiment of the present invention, elements at a node maybe identified as having a particular node structure.

Before describing the electronic rules checker 100 with tri-state identification and quality assurance logic of the present invention, reference will first be made to FIGS. 5A–5C through 10A–10B, which are schematic diagrams that illustrate the element structures to be identified. The structures identified include, but are not limited to, a complementary pass FET and probable complementary pass FETs, a probable special complementary pass FET and a special complementary pass FET, gate output and a probable gate output, a feedback FET and a probable feedback FET, a RAM pass FET, and single pass FETs, respectively.

Figure 5A:
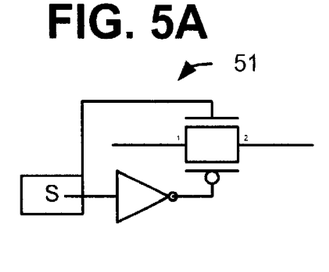
FIG. 5A is a schematic diagram illustrating a complementary pass FET configuration identified by the electrical rules checker shown in FIG. 3.

FIG. 5A illustrates an example of complementary pass FET 51 circuit configuration. In short, a complementary pass FET is defined by a channel-parallel connection between a P-type field effect transistor (PFET) and an N-type field effect transistor (NFET), where the gate node of the PFET is driven by the inverse signal of the gate node of the NFET.

Figure 5B:
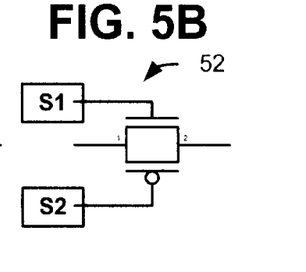
FIG. 5B and 5C are schematic diagrams illustrating probable complementary pass FET configurations identified by the electrical rules checker shown in FIG. 3.
Figure 5C:
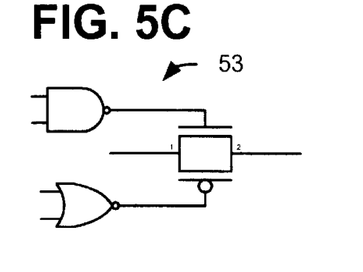

Illustrated in FIGS. 5B and 5C are examples of probable complementary pass FETs circuit configurations 52 and 53. In short, probable complementary pass FET circuits can be defined by a PFET and an NFET sharing a diffusion area where the controlling signals of the PFET and the NFET are unknown.

Figure 6A:
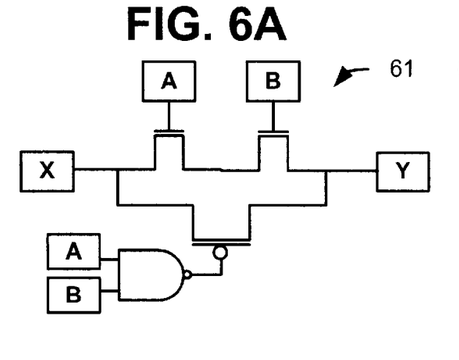
FIG. 6A is a schematic diagram illustrating a special complementary pass FET configuration identified by the electrical rules checker shown in FIG. 3.

Illustrated in FIG. 6A is an example of special complementary pass gate 61 circuit configuration. In short, a special complementary pass gate is defined by a PFET that is in parallel with two NFETs that are in series. In this implementation, the controlling signal of PFET is the logical NAND of the two known input signals to the NFETs.

Figure 6B:
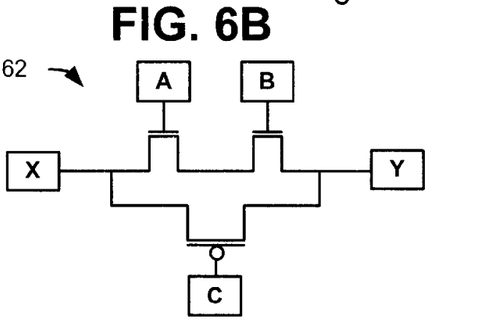
FIG. 6B is a schematic diagram illustrating a probable special complementary pass FET configuration identified by the electrical rules checker shown in FIG. 3.

Illustrated in FIG. 6B is an example of a probable special complementary pass gate circuit configuration 62. In short, a probable special complementary pass gate circuit can be defined by a PFET that is in parallel with two NFETs that are in series. In this implementation, the controlling signals of PFET and the NFETs are unknown.

Figure 7A:
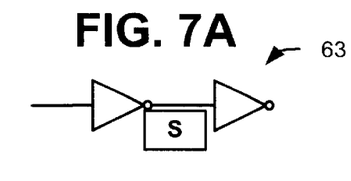
FIG. 7A is a schematic diagram illustrating a gate output configuration identified by the electrical rules checker shown in FIG. 3.

Illustrated in FIG. 7A is an example of gate output circuit configuration 63. In short, a gate output is defined by a signal where the gate driving the signal is known.

Figure 7B:
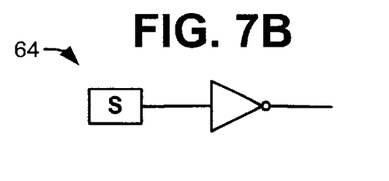
FIG. 7B is a schematic diagram illustrating a probable gate output configuration identified by the electrical rules checker shown in FIG. 3.

Illustrated in FIG. 7B is an example of a probable gate output circuit configuration 64. In short, probable gate output configurations can be defined as where the element driving the signal is unknown.

Figure 8A:
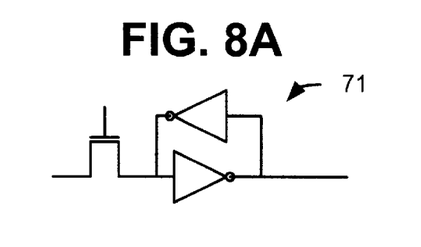
FIG. 8A is a schematic diagram illustrating a feedback FET configuration identified by the electrical rules checker shown in FIG. 3.

Illustrated in FIG. 8A is an example of feedback FET circuit configuration 71. In short, a feedback FET 71 is defined as an element that is part of a recycle loop and sustains a value on a node, but does not provide additional logic function for the gate. In other words, the element sustains a value without contributing to the logical definition of the gate.

Figure 8B:
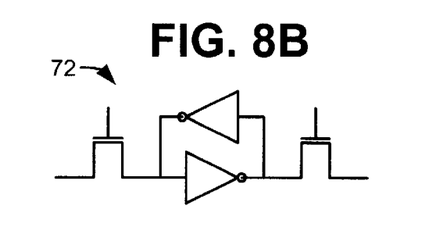
FIG. 8B is a schematic diagram illustrating a probable feedback FET configuration identified by the electrical rules checker shown in FIG. 3.

Illustrated in FIG. 8B is an example of a probable feedback FET circuit configuration 72. In short, a probable feedback FET 72 circuit can be defined as an element that is part of a recycle loop in which the logic flow through the gate is unknown.

Figure 9:
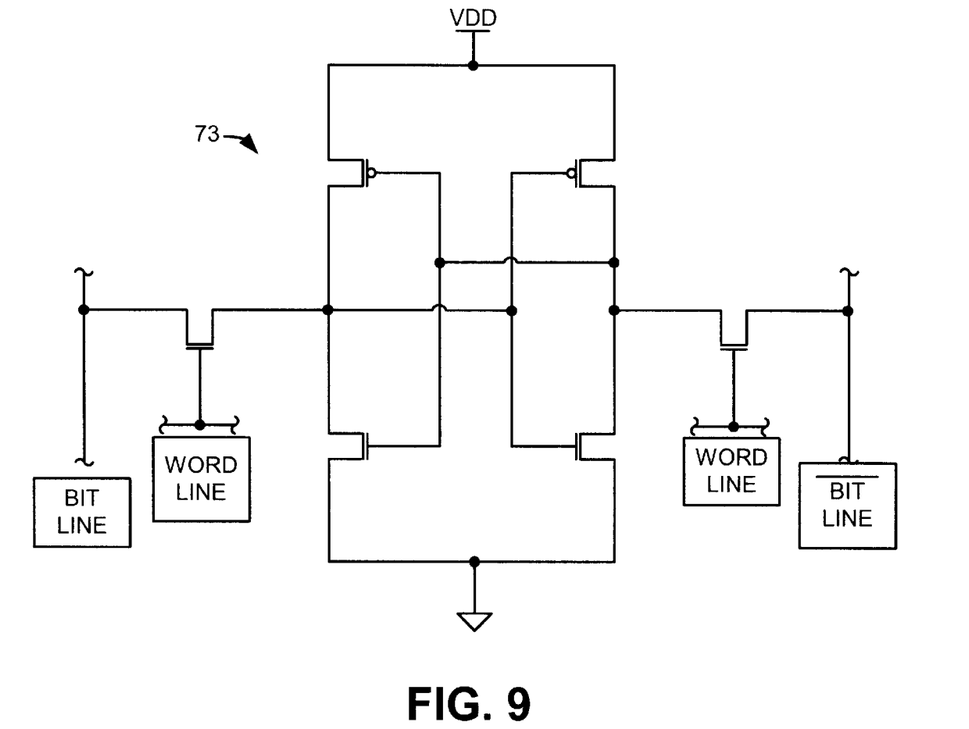
FIG. 9 is a schematic diagram illustrating a RAM pass FET configuration identified by the electrical rules checker shown in FIG. 3.

Illustrated in FIG. 9 is an example of a circuit configuration for a RAM pass FET, which is denoted by reference numeral 73. In short, a RAM pass FET 73 is defined by a RAM cell comprised of cross-coupled inverters. As is further known, an inverter is constructed from a pair of FETs, specifically comprising a PFET series connected (channel nodes) with an NFET, wherein the series connected devices are connected between VDD and ground. The input to such an inverter is applied to the gate node of both FET devices, and the output is taken from the common channel node between the two FET devices. Certainty of a RAM pass FET increases when it is known that the bit lines are also connected to other RAM pass FETs or similar structures. A probable RAM pass FET circuit configuration occurs with a similar structure, when the bit lines connections are unknown.

Figure 10A:
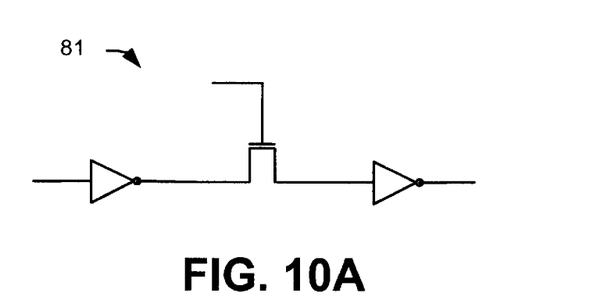
FIGS. 10A and 10B are schematic diagrams illustrating single pass FET configurations for NFET and PFET, respectively, identified by the electrical rules checker shown in FIG. 3.

Illustrated in FIG. 10A is an example of single pass FET 81 for an NFET circuit configuration. A pass FET is broadly defined as comprising a gate that interconnects an output of one gate to an input of another gate. In short, a single pass FET for an NFET circuit configuration is defined by interconnecting the output of an inverter to the input of a second inverter by an NFET.

Figure 10B:
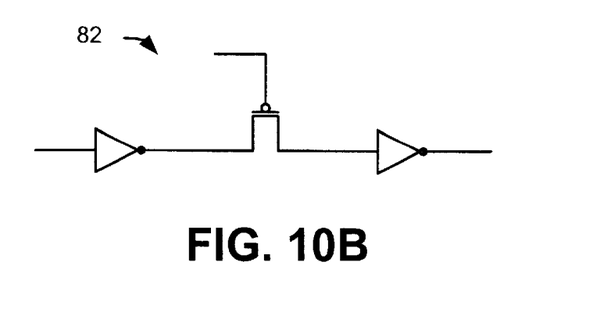

Illustrated in FIG. 10B is an example of a single pass FET 82 for a PFET circuit configuration. In short, a single pass FET configuration for a PFET circuit configuration can be defined by interconnecting the output of an inverter to the input of a second inverter by a PFET.

Certainty of a single pass FET configuration increases when the input into and the output from the single pass FET are known. A probable single pass FET configuration occurs when either the input into or the output from the single pass FET are unknown.

Figure 11:
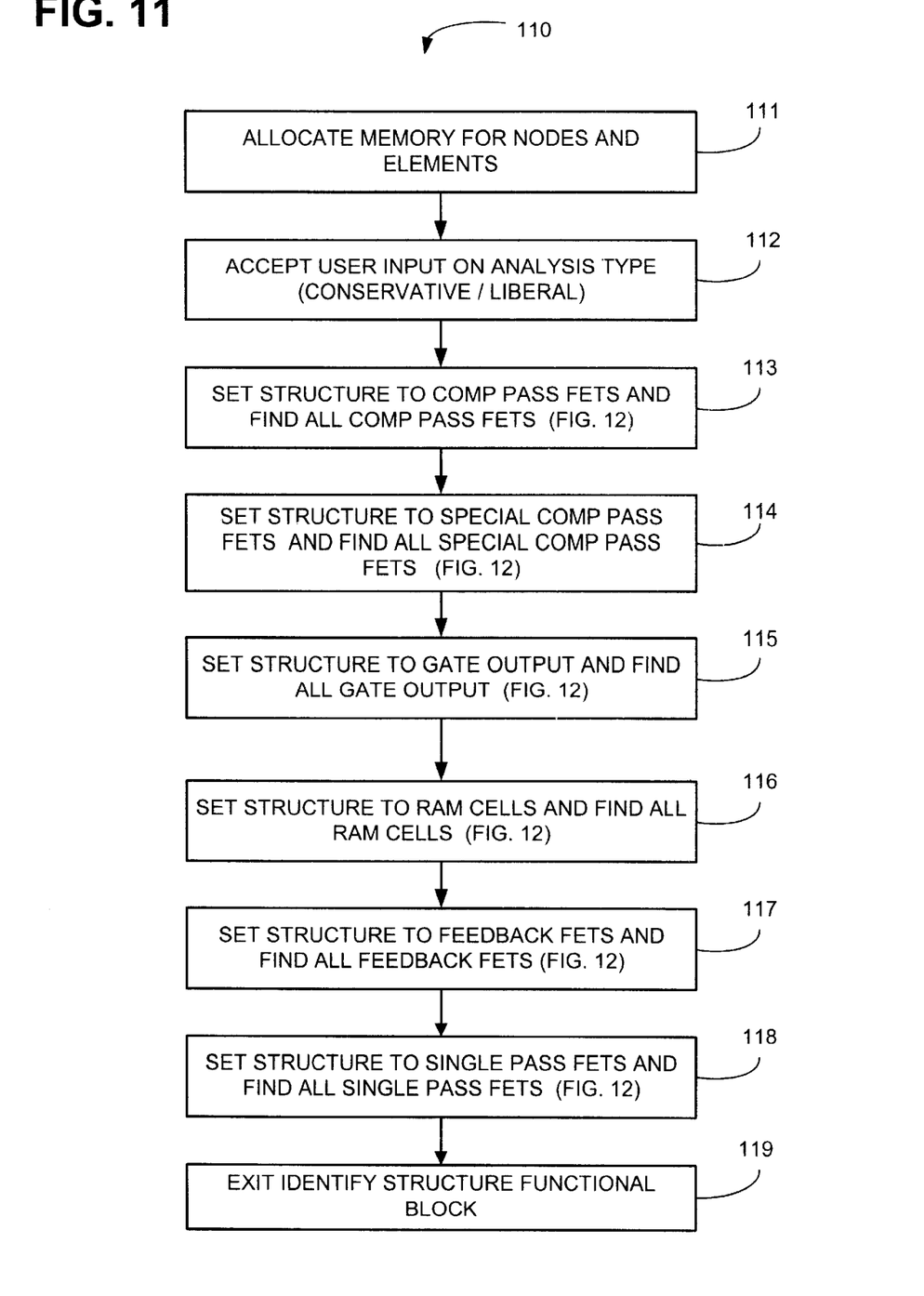
FIG. 11 is a flowchart illustrating one possible implementation of a method to identify structure functional block, in conjunction with the electrical rules checker shown in FIG. 3, which is to identify element structure types.
Figure 12:
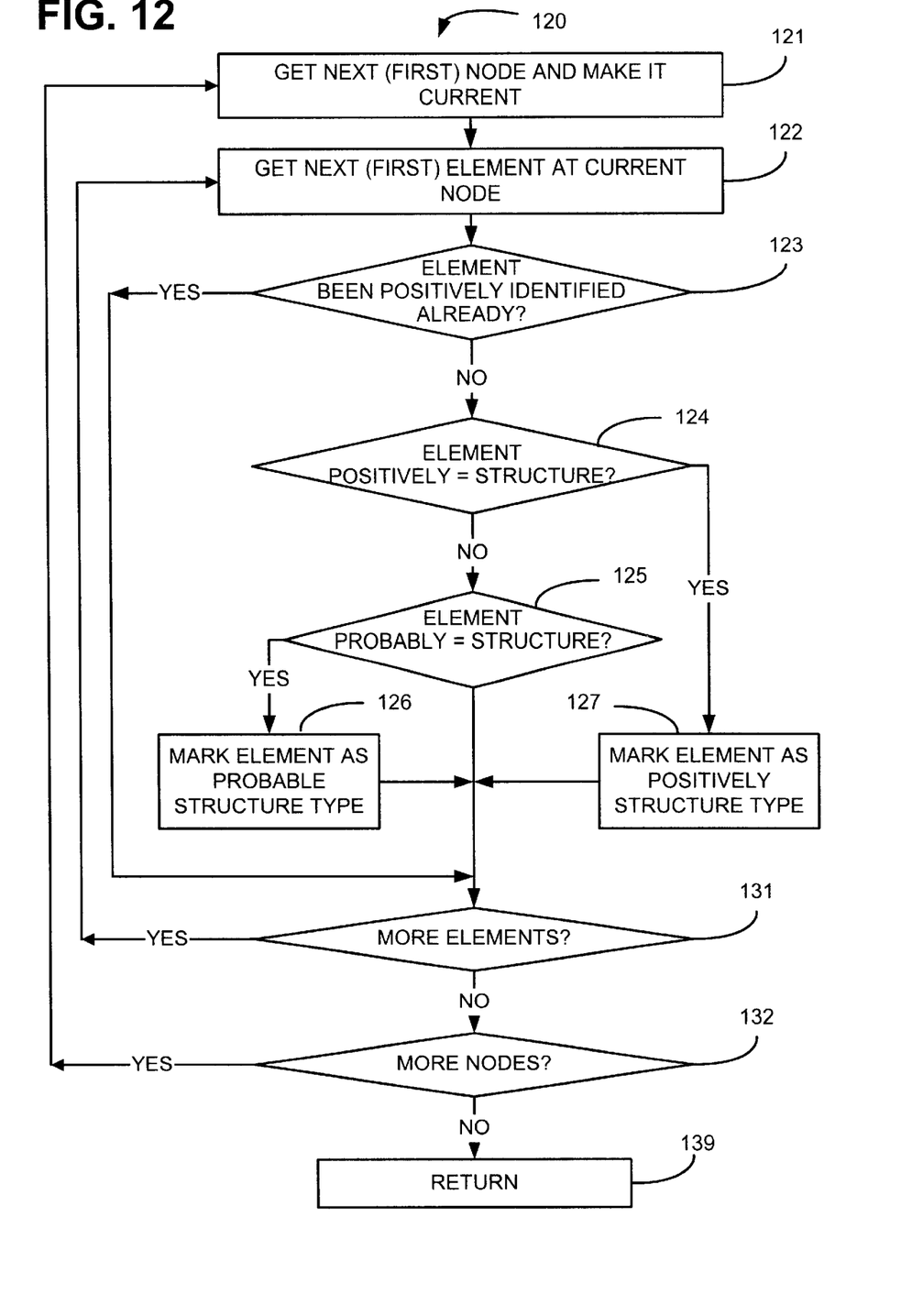
FIG. 12 is a flowchart illustrating one possible implementation of a method of the present invention used, in conjunction with the electrical rules checker shown in FIG. 3, to mark an element structure.
Figure 13:
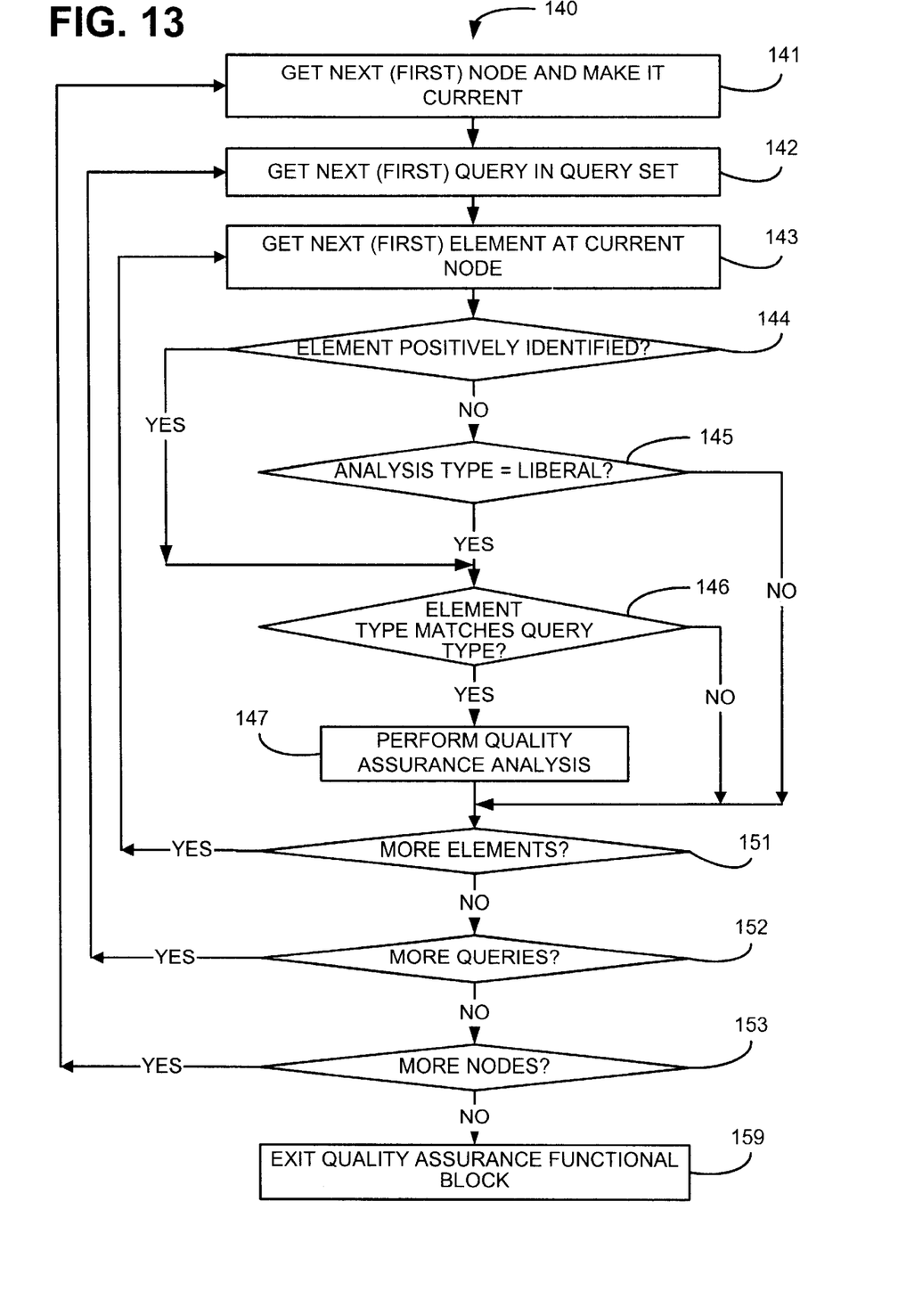
FIG. 13 is a flowchart illustrating one possible implementation of the method of the present invention used in conjunction with the electronic rules checker shown in FIG. 3, to establish the quality of the assumed tri-state logic.

Having set forth the basic and probable circuit configurations of the various structures identified by the method of the present invention, reference is now made to FIGS. 11–13, which collectively comprise a flow chart that illustrates the top-level functional operation of the electrical rules checker method in accordance with the preferred embodiment of the present invention.

In short, the electrical rules checker method makes numerous passes through each node and each element in the netlist to identify the elements structures. In a first pass, the method identifies all complementary pass FET configurations and probable complementary pass FET configurations, and will set the appropriate flag(s) in the data structure for each element, accordingly. On a second pass through the netlist, the method identifies all special complementary pass FET configurations and probable special complementary pass FET configurations, and will set the appropriate flag(s) in the data structure for each element, accordingly. On a third pass through the netlist, the method identifies all gate output configurations and probable gate output configurations, and will set the appropriate flag(s) in the data structure for each element, accordingly. On a fourth pass through the netlist, the method identifies all RAM cell configurations and probable RAM cell configurations, and will set the appropriate flag(s) in the data structure for each element, accordingly. On a fifth pass through the netlist, the method identifies all feedback FET configurations and probable feedback FET configurations, and will set the appropriate flag(s) in the data structure for each element, accordingly. Finally, in the pass through the netlist, the tri-state identification method identifies all single pass FET configurations and probable single pass FET configurations, and sets the appropriate flag(s) in the data structure for each element.

In the preferred embodiment, the element structures are identified in a particular order. The order depicted illustrates the identification of the easiest to identify elements first. The remaining elements in increasing degree of difficulty to identify are then processed with the hardest elements to identify preformed last. It is understood that other orders to identify the elements, including random or pseudo-random order, are possible.

Illustrated in FIG. 11 is a flowchart illustrating one possible implementation of the identify structure functional block process 110, used in conjunction with the electrical rules checker 100 (FIG. 3), to identify element structure types. This process is hereafter referred to as the to identify structure process 110. In this regard, the method begins by allocating memory to save the element structures of the nodes and elements at step 111.

Next, the identify structure process 110 sets the structure to be identified to a complementary pass FET. The mark element structure process 120 is performed using the identified structure at step 112. The mark element structure process 120 is herein defined in further detail with regard to FIG. 12. The identify structure process 110 then sets the structure be identified to a special complementary pass FET and executes the mark element structure process 120 using the identified structure. Then, the structure to be identified is set to gate outputs and the mark element structure process 120 is performed to identify and mark gate outputs at step 114. Next, the identify structure process 110 sets the structure to be identified to RAM cells and executes the mark element structure process 120 with the identified structure as a RAM cell at step 115. At step 116, the structure to be identified is set equal to a feedback FET, and the mark element structure process 120 is performed to identify the feedback FETs. Lastly, the structure to be identified is set equal to a single pass FET and the mark element structure process 120 is performed to identify the single pass FETs at step 117. After identifying all positive and probable element structure, the identify structure process 110 then exits at step 119.

In this example, the element structures are identified in a particular order. The order depicted in the example is that of easiest to identify to hardest to identify order. It is understood that other orders to identify the elements, including random order, are possible.

Illustrated in FIG. 12 is a flowchart illustrating one possible implementation of the mark element structure process 120 used in conjunction with the electrical rules checker 100 (FIG. 3), to mark element structure types. First, the mark element structure process 120 gets the first or next node and makes that node current at step 121. The first or next element at the current node is then obtained at step 122. The mark element structure process 120 then determines if the element has been positively identified already at step 123. If the element has been positively identified previously, the mark element structure process 120 then skips to determine if there are more elements at the current node at step 131.

If it is determined at step 123 that the element has not been positively identified already, the mark element structure process 120 then determines at step 124, whether the element positively equals the structure to be identified. The structure to be identified was previously set prior to the execution of the mark element structure process 120 in FIG. 11. If it is determined at step 124 that the current element positively equals the structure to be identified, the element is marked as positively equal to the structure type at step 127. The mark element structure process 120 then determines whether there are more elements at step 131.

If it is determined at step 124 that the element does not positively equal the structure to be identified, the mark element structure process then determines whether the element is probably equal to the structure to be identified at step 125. In determining if the element probably equals the structure to be identified, the mark element structure process 120 compares the current element against a number of structure types that closely resemble the structure to be identified. If the current element structure is closely related to any one of the known relative structure types indicating that the element is probably an element of the structure to be identified, the element is marked as a probable structure type at step 126.

Next, at step 131, the mark element structure process 120 then determines whether there are more elements at the current node. If it is determined at step 131 that there are more elements at the current node, the mark element structure process 120 then returns to repeat steps 122 through 131 by getting the next element at the current node. If it is determined at step 131 that there are no more elements at the current node, the mark element structure process 120 then determines if there are more nodes in the node list at step 132. If it is determined at step 132 that there are more nodes in the node list, the mark element structure process 120 then returns to get the next node and make it current and repeat steps 121 through 132. If it is determined at step 132 that there are no more nodes in the node list, the mark element structure process 120 then returns at step 139.

Illustrated in FIG. 13 is a flow chart illustrating one possible implementation of the quality assurance process 140 used in conjunction with the electrical rules checker 100 (FIG. 3). This process is hereafter referred to as the to quality assurance process 140. The quality assurance functional block process is used to evaluate the quality of the element structures identified in the identified structure functional block process 110 (FIG. 11 and FIG. 12). First, the quality assurance process 140 gets the first or next node and makes that node current at step 141. At step 142, the quality assurance process 140 receives the first or next query in the query set. At step 143, the first or next element at the current node is obtained.

At step 144, the quality assurance process 140 determines whether the element has been previously positively identified. If the element has been previously positively identified, the quality assurance process 140 then proceeds to step 146. If the current element at the current node has not been positively identified, the quality assurance process 140 then determines whether the analysis type for that non-positively identified element was liberal. If it is determined at step 145 that the analysis type of the current element was not liberal, the quality assurance process 140 then skips to step 151. If it is determined at step 145 that the analysis type of the current element was liberal, the quality assurance process 140 then determines whether the element type matches the current query type at step 146. If it is determined that the current element at the current node does not match the query type, the quality assurance process 140 then skips to step 151. If it is determined at step 146 that the current element does match the query type, the quality assurance process 140 then performs the quality assurance analysis at step 147. Through this process, each element is analyzed with respect to each node of the design, therefore complete coverage is provided.

At step 151, the quality assurance process 140 determines whether there are more elements at the current node. If it is determined at step 151 that there are more element of the current node, the quality assurance process 140 then returns to repeat steps 143 through 151 by getting the next element at the current node. If it is determined at step 151 that there are no more elements at the current node, the quality assurance process 140 then determines whether there are more queries in the query set at step 152.

If there are more queries to be performed on the elements of the current node, the quality assurance process 140 then returns to repeat steps 142 through 152. If it is determined that there are no more queries in the query sets to be applied to the elements at the current node, the quality assurance process 140 then determines whether there are more nodes in the node list to be processed at step 153.

If it is determined at step 153 that there are more nodes in the node list, the quality assurance process 140 returns to get the next node and make it current, then repeats steps 141 through 153. If it is determined at step 153 that there are no more nodes in the node list, the quality assurance process 140 then exits at step 159.

Having described the method of the present invention, it will be appreciated that the steps illustrated in the flow charts of FIGS. 11–13 are provided for purposes of illustration and are not deemed to be limiting on the broader aspects of the present invention. Indeed, the broader aspects of the present invention may be implemented using a variety of different approaches that are still consistent with the scope and content of the present invention.

It should be appreciated that the flow charts of FIGS. 11–13 show the top-level operation of only one possible implementation of the methods of the present invention. In this regard, when implemented in software or firmware, as in the case of the preferred embodiment, each block represents a module, segment, or portion of code, which comprises one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for appraising tri-state logic connected to a selected node of an integrated circuit by evaluating a netlist at the node comprising the steps of:

selecting a circuit configuration to be identified;
   identifying any of said circuit configurations at the node;
   identifying any probable circuit configurations at the node; and
   appraising said circuit configurations and said probable circuit configurations.

2. The method as defined in claim 1, wherein the step of appraising said circuit configurations and said probable circuit configurations further includes the step of:

obtaining a circuit configuration query type.

3. The method as defined in claim 2, wherein the step of appraising said identified circuit configurations and said probable circuit configurations further includes the step of:

determining if a circuit configuration is not positively identified.

4. The method as defined in claim 3, wherein the step of determining if a circuit configuration is not positively identified further includes the step of:

determining if a non-positively identified circuit configuration is to be appraised.

5. The method as defined in claim 3, wherein the wherein the step of appraising said identified circuit configurations and said probable circuit configurations further includes the step of:

performing quality analysis on any said circuit configurations and said probable circuit configurations that match said circuit configuration query type.

6. A system for appraising tri-state logic connected to a selected node of an integrated circuit by evaluating a netlist at the node comprising:

means for selecting a circuit configuration to be identified;
   means for identifying any of said circuit configurations at the node;
   means for identifying any probable circuit configurations at the node; and
   means for appraising said identified circuit configurations and said probable circuit configurations.

7. The system of claim 6, further comprising:

a means for obtaining a circuit configuration query type.

8. The system of claim 7, further comprising:

a means for determining if a circuit configuration is not positively identified.

9. The system of claim 8, further comprising:

a means for determining if a non-positively identified circuit configuration is to be appraised.

10. The system of claim 8, further comprising:

a means for performing quality analysis on any said circuit configurations and said probable circuit configurations that match said circuit configuration query type.

11. A computer readable storage medium containing program for appraising tri-state logic connected to a selected node of an integrated circuit by evaluating a netlist at the node comprising:

a first code segment configured to selecting a circuit configuration to be identified;
    a second code segment configured to identify any of said circuit a given node in a netlist; and
    a third code segment configured to identify any probable circuit configurations at the node in a netlist; and
    a fourth code segment configured to appraise said identified circuit configurations and said probable circuit configurations.

12. The program code of claim 11, wherein said fourth code segment is further configured to obtaining a circuit configuration query type.

13. The program code of claim 12, wherein said fourth code segment is further configured to determine if a circuit configuration is not positively identified.

14. The program code of claim 13, wherein said fourth code segment is further configured to determining if a non-positively identified circuit configuration is to be appraised.

15. The program code of claim 14, wherein said fourth code segment is further configured to performing quality analysis on any said circuit configurations and said probable circuit configurations that match said circuit configuration query type.

* * * * *